US007501906B2

(12) United States Patent
Dimarcq et al.

(10) Patent No.: US 7,501,906 B2
(45) Date of Patent: Mar. 10, 2009

(54) METHOD FOR MODULATING AN ATOMIC CLOCK SIGNAL WITH COHERENT POPULATION TRAPPING AND CORRESPONDING ATOMIC CLOCK

(75) Inventors: Noël Dimarcq, Etampes (FR); Stéphane Guerandel, Sceaux (FR); Thomas Zanon, Paris (FR); David Holleville, Paris (FR)

(73) Assignee: Centre National de la Recherche Scientifique- C.N.R.S, Paris (FR)

( * ) Notice: Subject to any disclaimer, the term of this patent is extended or adjusted under 35 U.S.C. 154(b) by 181 days.

(21) Appl. No.: 10/594,575

(22) PCT Filed: Mar. 29, 2005

(86) PCT No.: PCT/FR2005/000754

§ 371 (c)(1),
(2), (4) Date: Mar. 27, 2007

(87) PCT Pub. No.: WO2005/101141

PCT Pub. Date: Oct. 27, 2005

(65) Prior Publication Data

US 2007/0200643 A1 Aug. 30, 2007

(30) Foreign Application Priority Data

Mar. 30, 2004 (FR) .................................. 04 03289

(51) Int. Cl.
*H03L 7/00* (2006.01)

(52) U.S. Cl. ......................................... 331/94.1; 331/3

(58) Field of Classification Search ..................... 331/3, 331/94.1
See application file for complete search history.

(56) References Cited

U.S. PATENT DOCUMENTS 7,378,913 B2 * 5/2008 Laiacano et al. ............... 331/3

FOREIGN PATENT DOCUMENTS

FR 2 581 261 10/1986
GB 1 068 272 5/1967

OTHER PUBLICATIONS

Zanon T et al: "Coherent population trapping with cold atoms", IEEE International Frequency Control Symposium, New York, NY May 4, 2003 pp. 49-54.
Vanier J et al: "Atomic clocks based on coherent population trapping: basic theoretical models and frequency stability" May 4, 2003, pp. 2-15.

* cited by examiner

*Primary Examiner*—Arnold Kinkead
(74) *Attorney, Agent, or Firm*—Young & Thompson

(57) ABSTRACT

Method for modulating an atomic clock signal and a corresponding atomic clock. The laser beams (L1, L2) are pulse-modulated in amplitude to illuminate (A) an interactive medium. A detection (B) of the current pulse (Sr) and of the pulses (Sr−1 to Sr−p) preceding said current impulsion is performed. The pulses are superimposed (C) by linear combination to generate a compensated atomic clock signal (SHC) whereof the spectral width is minimized. The invention is applicable to atomic clocks with pulsed interrogation whereof the interactive medium consists of thermal or laser-cooled atoms.

20 Claims, 5 Drawing Sheets

METHOD FOR MODULATING AN ATOMIC CLOCK SIGNAL WITH COHERENT POPULATION TRAPPING AND CORRESPONDING ATOMIC CLOCK

Atomic clocks with coherent population trapping, known as CPT ("coherent population trapping") clocks, are known from the prior art.

In general, and as illustrated in FIG. 1*a*, atomic clocks use an interactive medium, generally formed by caesium or rubidium atoms excited by a radioelectric signal produced by a local oscillator LO and a synthesizer S at an excitation frequency and formed by a microwave signal at 6.8 GHz and 9.2 GHz respectively for rubidium and caesium. The atoms of the interactive medium are excited between two energy levels e and f illustrated in FIG. 1*b*. This excitation mode is referred to as the Rabi interrogation mode if the interaction is continuous and as the Ramsey interrogation mode if the interrogation is based on two short interactions separated by a dead time.

The response signal derived from the interaction has an amplitude according to the correspondence to the resonance of the excitation signal. The response signal may be detected by optical absorption, by magnetic selection, optical fluorescence or magnetic detection.

A system for automatic control of the local oscillator based on the response signal provides at the output of this oscillator a periodic signal $S_u$ having precision and frequency stability qualities comparable to those of the resonance frequency e→f.

Returning to the general principle of automatic control described above, CPT clocks also use an interactive medium illuminated by two laser waves and implement a continuous interrogation mode.

In a prior embodiment, the interactive medium consisting of sodium is spatially separated into two distinct interactive zones, separated by a distance of 30 cm.

The laser beams allow the production of a resonance by Raman transition at 1,772 MHz, the central fringe of the pattern of Ramsey fringes being brought to a width of 650 Hz owing to an interaction produced in the interactive zones.

For a more detailed description of this type of atomic clock, reference may usefully be made to the article entitled "Observation of Ramsey Fringes using a Simulated, Resonance Raman Transition in a Sodium Atomic Beam" published by T. E. Thomas, P. R. Hemmer, and S. Ezekiel, Research Laboratory of Electronics, Massachusetts Institute of Technology, Cambridge, Mass. 02 139 and C. C. Leiby, Jr., R. H. Picard and C. R. Willis, Rome Air Development Center, Hanscom Air Force Base, Massachusetts 01 731 PHYSICAL REVIEW LETTERS Volume 48, Number 13, 29 March 1982.

Generally, CPT-type atomic clocks carry out an interrogation in continuous mode using two phase-coherent laser waves. Each laser wave is near-resonant with an optical transition of the atoms 2→e and 2→f and the difference between the frequencies of the two waves is close to the atomic reference frequency f→e. If f→e corresponds to the resonance, the atoms of the interactive medium are trapped in a coherent superimposition of the states f and e corresponding to a black state. A decrease in the amplitude of the absorption of the laser waves and a decrease in the amplitude of the fluorescence signal are observed. The coherent superimposition of atomic states is also associated with a magnetization producing an electromagnetic wave oscillating at the frequency of the transition e→f in the microwave domain.

The absorption or the emission of fluorescence are minimal and the field of the electromagnetic wave emitted at a maximal amplitude at the resonance. The atomic clock signal corresponds to the variation in the amplitude of the signal detected by absorption, fluorescence or microwave emission, as a function of the value of the difference in frequency of the laser waves.

In all of the currently known types of CPT atomic clock, the interrogation of the interactive medium is continuous, the laser waves interacting continuously with the atoms of the interactive medium.

However, in the aforementioned types of atomic clock, excessively intense illumination of the interactive medium by the laser waves causes widening of the resultant resonance lines owing to optical saturation of the atoms of the interactive medium.

This drawback impairs the frequency stability of the atomic clock signal.

For this reason, current CPT atomic clocks seek to solve the aforementioned technical problem by reducing merely the intensity of illumination of the interactive medium by the laser beams used.

A measure of this type does not provide a solution to the aforementioned technical problem, as it actually makes the atomic clock signals, which are of low amplitude, derived from the interaction more difficult to detect.

The aforementioned low-amplitude atomic clock signals are detected under impaired signal-to-noise ratio conditions, and this again impairs the frequency stability of the atomic clock.

The present invention aims to remedy the technical problem of the optical saturation of the interactive media of atomic clocks, in particular CPT clocks or the like, while at the same time maintaining non-impaired signal-to-noise ratio conditions.

The present invention also seeks to obtain, by a specific treatment of the response signal produced by the interrogation of the interactive medium in current CPT atomic clocks, an increase in the contrast of the interference fringes in Ramsey mode and a decrease in the slow variations in amplitude or drifts of the atomic clock signal produced, in particular, by the irreducible fluctuations in the operating parameters such as the frequency and the amplitude of the lasers interrogating the interactive medium.

Finally, the invention also relates to the implementation of a method for generating a CPT clock signal and of a corresponding CPT clock allowing this type of clock to be miniaturised with view to the industrial production of clocks in which the interactive cell does not exceed a volume of a few $mm^3$.

The method according to the present invention for generating an atomic clock signal with coherent population trapping uses a first and a second phase-coherent laser wave, each substantially in resonance with an optical transition of the atoms of an interactive medium. The coherent superimposition of the atomic states corresponding to the coherent population trapping of atoms provides a response signal having a resonance-external amplitude and representing the atomic clock signal corresponding to the variation in amplitude of the signal detected as a function of the value of the difference in frequency of the first and the second phase-coherent laser wave.

The method is notable in that it consists at least in modulating in synchronization by successive pulses the intensity of the first and the second laser wave, by a shape factor determined between a high level and a low level of intensity, the response signal produced during a current pulse being dependent on the atomic state produced during at least one pulse preceding this current pulse and on the development of this atomic state for the duration of a low level of intensity separating these pulses.

The response signal is detected and superimposed by linear combination of the response signal produced during this current pulse and at least one pulse preceding this current pulse, to produce a resultant compensated atomic clock signal, the spectral width of which is minimized.

The atomic clock with pulsed interrogation according to the present invention comprises at least an optical interrogation module for producing a first and a second phase-coherent laser beam, each substantially in resonance with an optical transition of the atoms of an interactive medium, an interactive cell comprising this interactive medium, illuminated in operation by the first and the second phase-coherent laser beam, to produce a response signal having a resonance-external amplitude and corresponding to the variation in amplitude of the signal detected as a function of the difference in frequency of the first and the second phase-coherent laser beam and a module for detecting this response signal which is adapted to the wavelength and to the amplitude of the response signal.

The method is notable in that it further comprises a unit for pulse-modulating the intensity of the first and the second laser beam between a high level and a low level of intensity. This modulation unit is placed on the path of the first and the second laser beam, upstream of the interactive cell, to produce in synchronization a first and a second pulsed laser beam. The interaction between the first or the second laser beam respectively and the interactive medium is substantially limited to the duration of each successive pulse corresponding to a high level of intensity and the response signal produced during a current pulse is dependent on the atomic state produced during at least one pulse preceding this current pulse and on the development of this atomic state for the duration of a low level of intensity separating these pulses.

The detection module further comprises a module for adding by linear combination the response signal produced during this current pulse and the response signal produced during at least one pulse preceding this current pulse. The module for adding by linear combination produces a resultant compensated atomic clock signal, the spectral width of which is minimized.

The method and the atomic clock with coherent population trapping according to the present invention are used in the industrial implementation of on-board time keeping or frequency reference means which have a very low overall size and may be used, in particular, in spatial applications.

A better understanding of the method and the clock will be facilitated by reading the description and by examining the following drawings in which, in addition to FIGS. 1a and 1b relating to the prior art:

Figure 3:
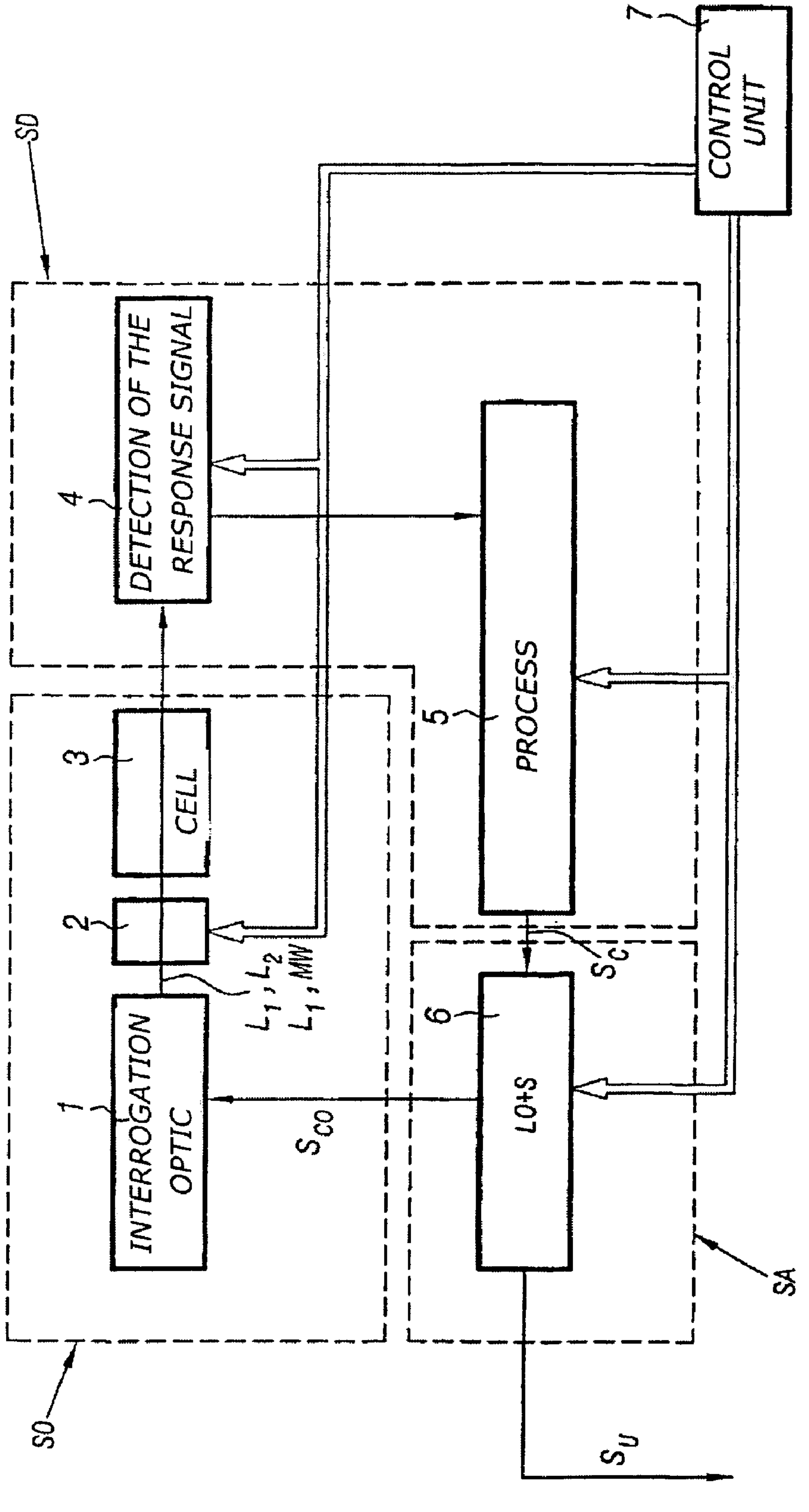
FIG. 3 shows, purely by way of example, a functional diagram of a CPT or other type of atomic clock in accordance with the subject-matter of the present invention, allowing the implementation of the method described in conjunction with FIGS. 2a, 2b and 2c.
Figure 4A:
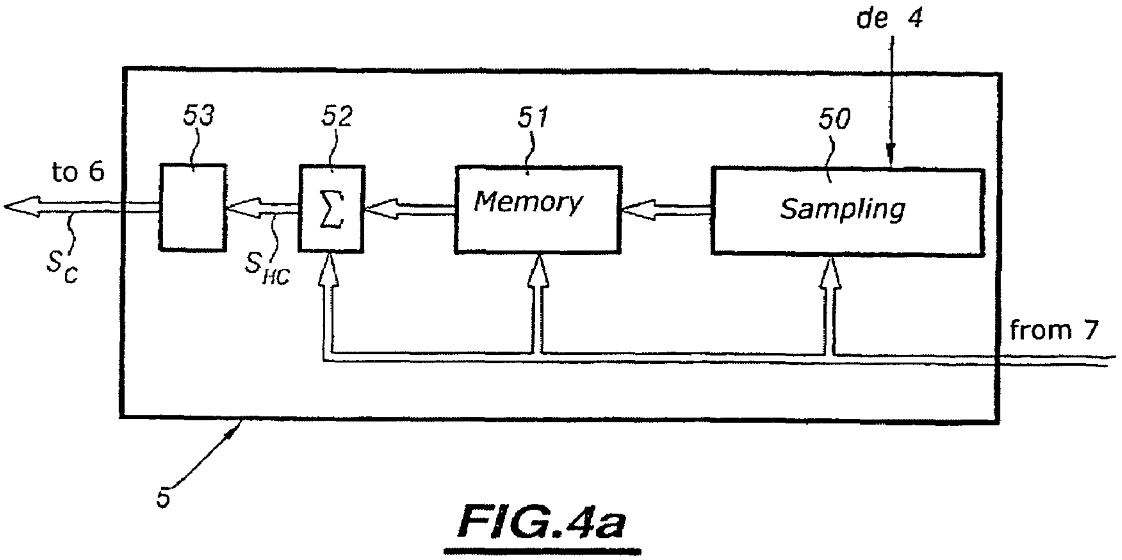
FIG. 4a shows, by way of example, a detailed diagram of a module for processing the response signal after detection, in a preferential non-limiting embodiment, this module for processing the response signal being, more particularly, suitable for carrying out dedicated digital processing.
Figure 4B:
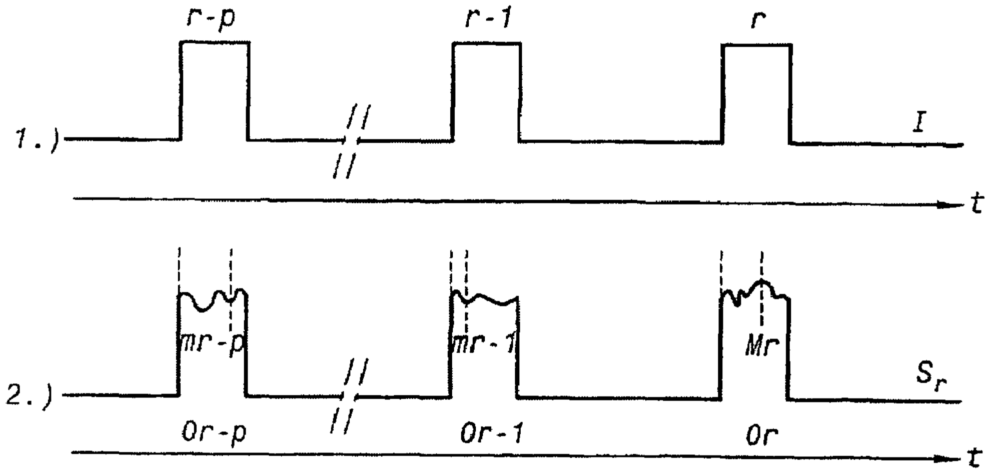
Figure 4C:
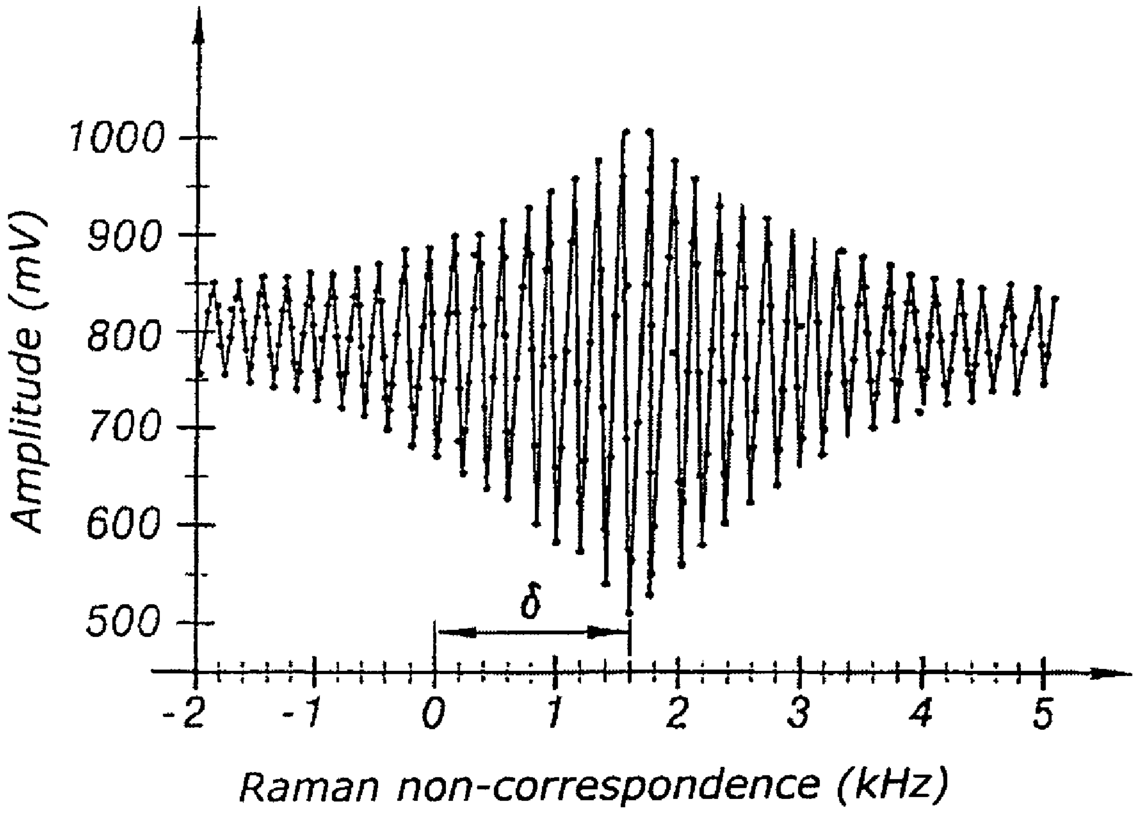

FIG. 4b shows, by way of example, a timing diagram for the carrying-out of operations on sampled values of successive response signal pulses, more particularly on a current pulse and at least one pulse preceding this current pulse, the operations conducted on the aforementioned sampled values allowing, in particular, substantial improvement to the spectral purity and the contrast of the resultant compensated atomic clock signal obtained, following the carrying out of these operations; and FIG. 4c shows, by way of example, an amplitude/frequency diagram of Raman non-correspondence, non-correspondence of the difference in frequency between the two laser waves and the Ramsey fringe pattern obtained at the output of the dedicated processing module illustrated in FIG. 3, after application of a superimposition by linear combination of the response signal produced during a current pulse and at least one pulse preceding this current pulse.

The method according to the present invention for generating an atomic clock signal with coherent population trapping will now be described with reference to FIGS. 2a, 2b and 2c.

Generally, it will be noted that, in accordance with the principles of the mode of operation of CPT atomic clocks, the method according to the present invention is carried out on the basis of a phase-coherent first laser wave $L_1$ and second laser wave $L_2$.

Figure 1A:
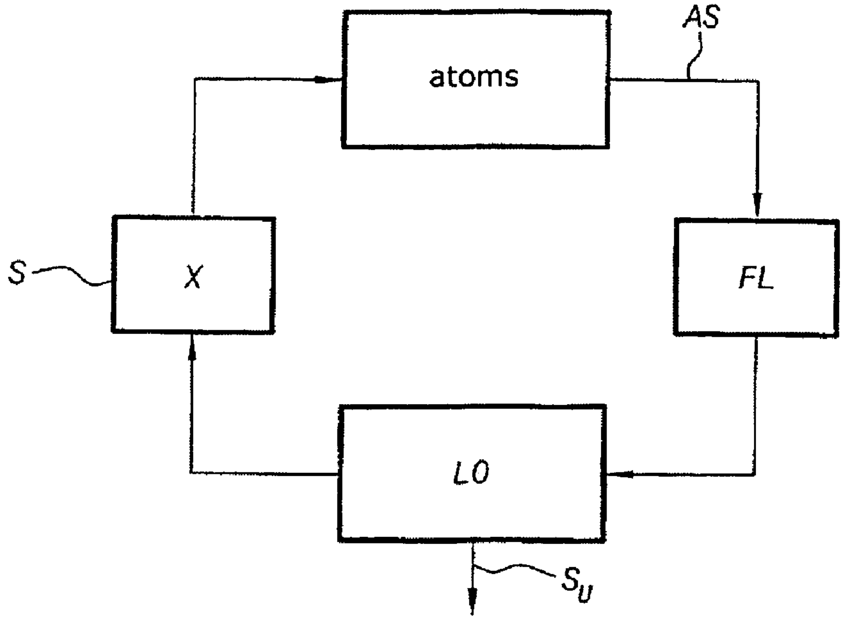
FIG. 1a (prior art)
Figure 1B:
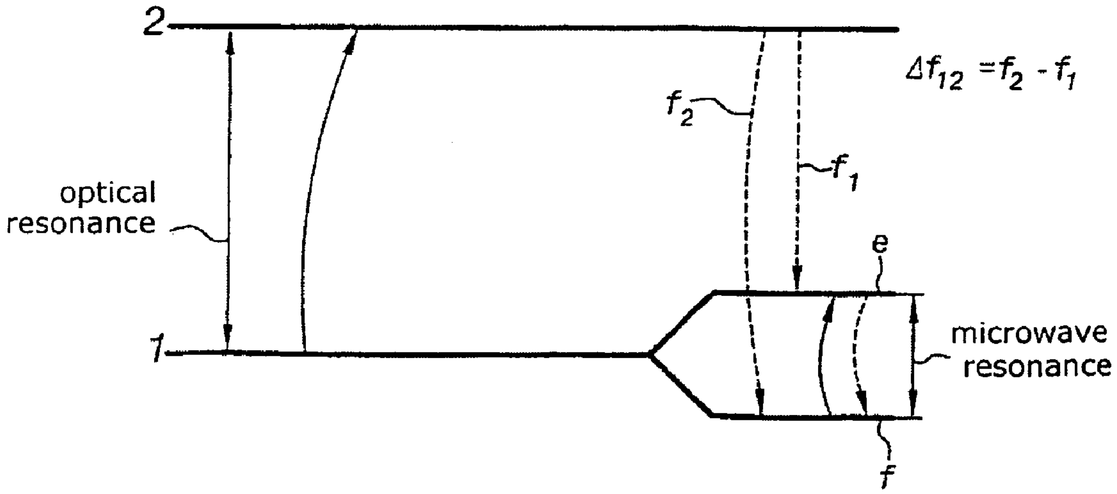
FIG. 1b (prior art)

With reference to FIG. 1b, each of the aforementioned laser waves is substantially in resonance with an optical transition of the atoms of an interactive medium, the laser waves $L_1$ and $L_2$ being said to be emitted at a frequency $f_1$ and $f_2$ and at their corresponding wavelength in vacuum or air, the difference in frequency of the aforementioned laser waves being denoted as $\Delta f_{12}$. Preferably, the laser waves L1 and L2 are polarized either circularly or linearly in an orthogonal manner.

The coherent superimposition of the atomic states corresponding to the coherent population trapping of atoms as illustrated in FIG. 1b produces a response signal in the microwave domain having a resonance-external amplitude and representing the atomic clock signal corresponding to the variation in amplitude of the response signal detected as a function of the value of the difference in frequency $\Delta f_{12}$ of the phase-coherent first and second laser waves $L_1$ and $L_2$.

It will be appreciated, in particular, that the mode of interaction of the first and second waves with the interactive medium corresponds physically to the continuous interactive mode known from the prior art.

However, and according to a particularly notable aspect of the method according to the invention, said method consists, at least in a step A, in modulating in synchronization by successive pulses the intensity of the first and second laser waves $L_1$, $L_2$ by a shape factor determined between a high level and a low level of intensity.

Figure 2A:
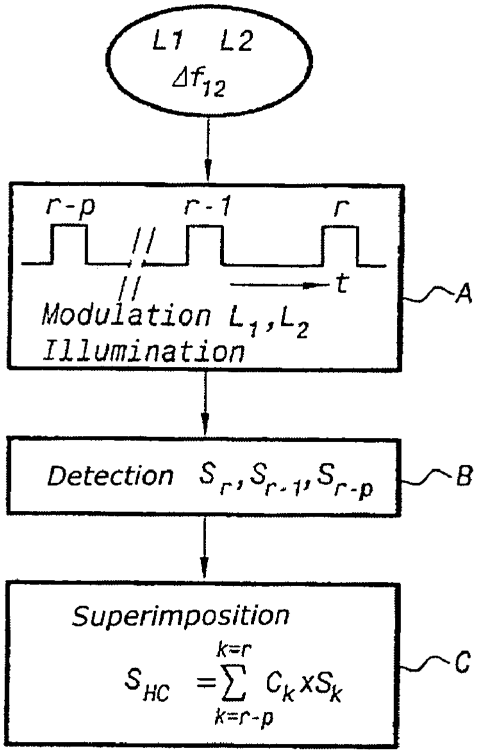
FIG. 2a shows, purely by way of example, a flow chart of the basic steps for carrying out the method according to the present invention.

FIG. 2a shows, in step A, the laser waves $L_1$ and $L_2$ modulated in synchronization by successive pulses, the successive pulses being said to have a rank r, r−1, . . . , r−p relative to an increasing time scale t.

Conventionally, the current pulse is said to have a rank r, the pulse immediately preceding this current pulse the rank r−1 and the successive preceding pulses being said to have a prior rank of successively up to r−p.

It will also be appreciated that the laser waves $L_1$ and $L_2$ are superimposed on the same optical path, and this obviously allows them to obtain coherent and in-phase modulated laser wave pulses under conditions which will subsequently be explained in the description.

It will thus be appreciated that the interaction between the first or second laser wave $L_1$, $L_2$ respectively, and in particular the pulsed form thereof, and the interactive medium is limited substantially to the duration of each successive pulse $S_r$, $S_{r-1}$ to $S_{r-p}$ corresponding to a high level of intensity.

Accordingly, the response signal produced during a current pulse, the above-described pulse of rank r, is dependent on the atomic state produced during at least one pulse preceding this current pulse, i.e. the preceding pulses of rank r−1 to r−p, and on the development of this atomic state for the duration of a low level of intensity separating the aforementioned pulses.

Following the modulation by successive pulses of the intensity of the first and second laser waves $L_1$, $L_2$ and, of course, the illumination of the interactive medium by the laser wave pulses thus obtained, the method according to the invention consists in a particularly notable manner in detecting, in step B, and superimposing by linear combination, in step C, the response signal produced during the current pulse, a response signal denoted by $S_r$ and having a rank r corresponding to that of the illumination pulse of the same rank and at least one pulse preceding this current pulse, to produce the resultant compensated atomic clock signal, the spectral width of which is minimized.

In FIG. 2*a*, the detection operation is illustrated in step B, the response signal being said to consist of the corresponding response signal $S_r$ of rank r and the prior successive response signals $S_{r-1}$ to $S_{r-p}$.

The operation of superimposition by linear combination is represented in step C of FIG. 2*a* and illustrated by the following linear combination formula:

$$S_{HC} = \sum_{k=r-p}^{k=r} C_k \times S_k$$

In the foregoing formula, it will be noted that $S_{HC}$ represents the resultant compensated atomic clock signal obtained by the aforementioned linear combination, $C_k$ designating a positive and/or negative weighting coefficient applied to each successive response signal pulse $S_k$.

Conventionally, and as will be described hereinafter in greater detail with reference to a CPT atomic clock in accordance with the subject-matter of the present invention, the weighting coefficient $C_k$ relating to the rank k=r of the current pulse may be taken to be equal to 1, so the coefficients of rank k=r, marked relative to the current pulse for the prior pulses, may then be taken to be successively equal to different negative values, for example, in order to correct and compensate the atomic clock signal finally obtained. The final rank of addition by linear combination k=r may be determined experimentally or taken as a parameter.

The implementation of the method according to the present invention is not limited to the modulation of the two laser waves $L_1$ and $L_2$ and to the CPT interaction.

Figure 2B:
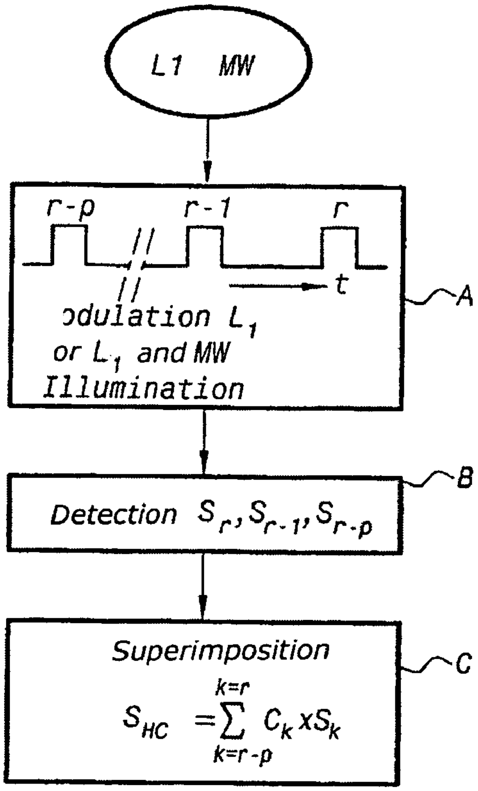
FIG. 2b shows, purely by way of example, a flow chart of the basic steps of a variation of the method according to the invention applied to a single laser wave and to a radiofrequency signal for exciting the interactive medium.

According to particularly advantageous embodiment of the method according to the invention, said method may also consist, as illustrated in FIG. 2*b*, in replacing one of the laser waves for exciting the interactive medium, the laser wave $L_2$ in FIG. 2*b*, with a radiofrequency signal MW, the frequency of which is substantially equal to the frequency of the transition e→f of the atoms of the interactive medium.

As illustrated in step A of FIG. 2*b*, the method according to the invention consists, in this variation, in modulating by successive pulses either the maintained laser wave $L_1$ or this maintained laser wave $L_1$ and the radiofrequency signal MW.

Figure 2C:
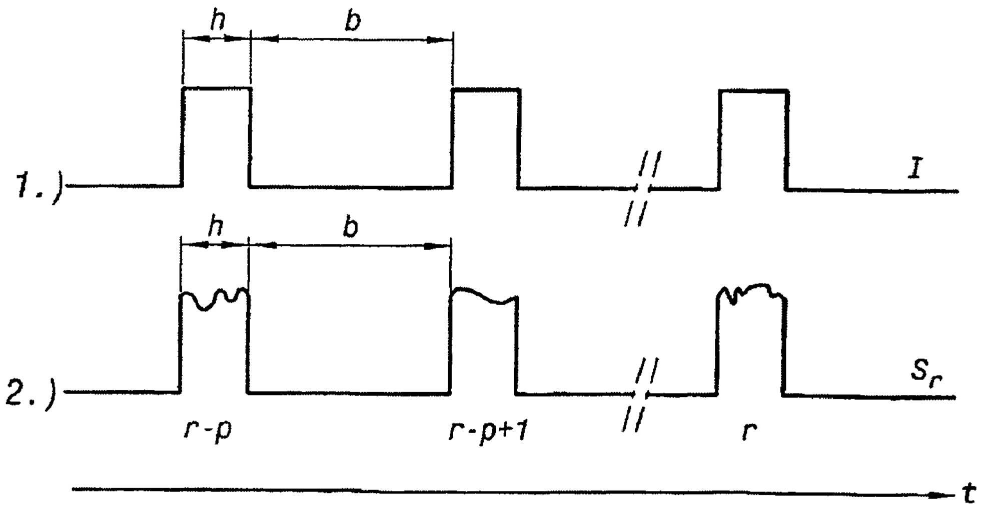
FIG. 2c shows, purely by way of example, at point 1), a timing chart of the pulsed laser beam pulse signals which may be used for carrying out the method according to the invention illustrated in FIG. 2a or 2b and, at point 2), a timing chart of the response signal obtained after detection at the output of the interactive cell.

With reference to FIG. 2*c*, it will be noted that the process for pulse-modulating the laser waves $L_1$ and $L_2$ or radiofrequency signal MW is advantageously carried out by pulse trains, the frequency of the modulation pulses being between 0.2 Hz and $10^4$ Hz.

With reference to the aforementioned FIG. 2*c* and to the time axis t, the high level of intensity of each pulse for a given pulse train has a duration h and the low level of intensity has a duration b.

Under these conditions, the frequency range of the modulated laser wave pulses illustrated at point 1 of FIG. 2*c* and, ultimately, of the response signal having successive ranks r, r−1, r−p is given by the value 1/h+b for the various values of h and b and the shape factor defined by the value h/h+b is then between $10^{-6}$ and $10^{-1}$.

It will obviously be appreciated that the modulated laser wave pulses I illustrated at point 1) may be obtained by an electronic control signal having precisely the aforementioned time and/or frequency characteristics of those illustrated at point 1) of FIG. 2*c*.

With regard to the choice of the interval of duration b separating the current pulse of rank r from the pulse preceding this current pulse or any prior pulse of rank r−1 to r−p in a modulation pulse train, it will be noted that this duration b is shorter than the lifetime of the hyperfine coherence existing between the two clock levels.

With regard to FIG. 1*b*, it will be noted that the two clock levels in question are the levels e and f, which determine the frequency of the resultant atomic clock signal, and that this lifetime depends basically on the relevant interactive medium.

One of the notable aspects of the method according to the present invention is, in particular, that said method may be carried out on the basis of interactive media consisting either of populations of thermal atoms contained in a cell or else of populations consisting of cold and, in particular, laser-cooled atoms.

In both cases, the interrogation procedure advantageously consists of a Ramsey interrogation mode with at least two pulses.

As far as the method for implementing the aforementioned interactive media is concerned, it will be noted that the thermal atoms are delivered in vapor or jet form. The laser-cooled atoms are obtained by causing the thermal atoms to interact with laser waves which are correctly matched to optical transitions of the atoms. The radiation pressure induced by the laser waves allows the kinetic energy of the atoms to be reduced rapidly. Samples of cooled atoms having very low erratic speeds, of approximately 1 cm/s, corresponding to a temperature of $10^{-6}$ K, well below that of the thermal atoms, of approximately a few hundred meters per second, are thus obtained at the temperature of 300 K.

The embodiment of an atom laser cooling cell allowing the interaction of one or two pulse-modulated laser beams, which embodiment is known from the prior art, will not be described in detail. Reference may usefully be made in this regard to the French patent application published under number 2 730 845 in the name of CNRS.

In the cooling procedure, it will be noted that the kinetic energy of the atoms or the variation in kinetic energy thereof is proportional to the drop in temperature from the initial value of 300 K to $10^{-6}$ K, the proportionality coefficient being dependent on the Boltzmann constant.

The procedure for detecting the response signal and, in particular, successive response signal pulses $S_r$ to $S_{r-p}$ is advantageously chosen from among the group of detection processes comprising optical absorption, optical fluorescence and microwave detection as a function of the frequency of the interrogation signal.

It will be appreciated that the method according to the present invention may be carried out in numerous situations in view of the nature of the chosen interactive medium, although the interrogation mode is preferably the Ramsey interrogation mode with at least two pulses, as stated above in the description. The detection processes are therefore the processes for detection by optical absorption, optical fluorescence and microwave detection as a function of the frequency of the aforementioned interrogation signal.

The following table determines the type of atomic clock which is capable of carrying out the method according to the present invention by indicating the atomic source used to allow the method to be carried out, the interrogation procedure or mode and the procedure for detecting the corresponding clock signal.

| TYPE OF ATOMIC CLOCK | ATOMIC SOURCE | INTERROGATION MODE | | DETECTION OF THE CLOCK SIGNAL |
|---|---|---|---|---|
| CPT (coherent population trapping on thermal atoms in cell) | Thermal steam with or without buffer gas | Optical interrogation (clock transition in the microwave domain) | Continuous in existing devices Pulsed interrogation in this type of clock | Optical absorption or microwave detection |
| CPT (coherent population trapping on cold atoms) | Steam + laser cooling | Optical interrogation (clock transition in the microwave domain) | Interrogation of pulsed type | Optical absorption or microwave detection |
| Rb clocks in optical pumping cell | Thermal steam with or without buffer gas | Simultaneous radiofrequency and optics | (continuous in existing devices) Pulsed interrogation in this type of clock | Optical absorption |

With reference to the foregoing table, it will be noted that the CPT-type atomic clocks allow the method of the invention according to FIG. 2$a$ to be carried out and that the rubidium-type atomic clocks in an optical pumping cell allow the method of the invention according to FIG. 2$b$ to be carried out.

A more detailed description of an atomic clock with pulsed interrogation in accordance with the subject-matter of the present invention will now be given with reference to FIG. 3 and the following figures.

Generally, it will be noted that the architecture of the atomic clock with pulsed interrogation in accordance with the subject-matter of the present invention corresponds to that illustrated in FIG. 3.

In particular, a clock of this type comprises in an optical section SO an optical interrogation module 1 for producing a first and a second phase-coherent laser beam $L_1$, $L_2$. As stated above, each of the aforementioned laser beams is substantially in resonance with an optical transition of the atoms of an interactive medium.

The atomic clock with pulsed interrogation further comprises an interactive cell 3 comprising the aforementioned interactive medium.

It will be noted that the interactive cell 3 may conventionally consist of a casing which is transparent to the laser beam $L_1$, $L_2$ and, of course, of any device which generates the interactive medium, i.e. thermal and/or laser-cooled atoms.

The interrogation module 1 produces the two laser beams $L_1$ and $L_2$, the difference in frequency of which is equal to the resonance frequency, the microwave frequency at 9.2 GHz for caesium and 6.8 GHz for rubidium, for example.

In the case of caesium, the frequencies of the laser diodes are approximately 852 nm for the line $D_2$ and 894 nm for the line $D_1$.

The aforementioned laser lines may be used for a CPT interaction as described above in the description.

Owing to their greater hyperfine interval in the excited state, the transitions of the line $D_1$ would appear to be more beneficial, as they allow reduction of both the losses of atoms caused by leakages to adjacent transitions and displacements of light.

It is also possible to use rubidium atoms for which the line $D_2$ is at 780 nm and the line $D_1$ is at 795 nm, the corresponding frequencies $f_2$ and $f_1$ being easily accessible with commercially available laser diodes.

Various procedures may be used for producing two radiations, i.e. the laser beams $L_1$ and $L_2$, which induce the coherent trapping of the population of atoms of the interactive medium. The difference in frequency between the laser beams $L_1$ and $L_2$ is equal to the clock frequency, i.e. the frequency of the atomic clock signal. The phase difference between the phases of the laser beams $L_1$ and $L_2$ must exhibit as little fluctuation as possible in order to prevent any destruction of the interference phenomenon. The emission power required for the laser beams is approximately 1 milliwatt.

In a specific embodiment, it will be noted that the interrogation optics may be produced from a single laser source to which there is applied a frequency modulation of several GHz of the sideband modulation type, the distance between the sidebands corresponding to the clock frequency. The two aforementioned lines with a phase coherence as good as that of the modulation signal are thus obtained.

The two lines or laser beams $L_1$ and $L_2$ are then physically superimposed in the conventional manner so that they follow the same optical path and are subjected to the same successive phase displacements until they are applied to the interactive medium.

With regard to the implementation of the method of the invention according to the variant illustrated in FIG. 2$b$, it will be noted that the radiofrequency signal MW, which may or may not be modulated in synchronization with the pulse-modulated maintained laser wave $L_1$, is applied in the conventional manner to the interactive cell 3.

It will be noted that the interactive cell 3 may be produced from a pyrex or quartz chamber.

Furthermore, buffer gases may be added in order to eliminate widening of the lines caused by the Doppler effect by passing into the Lamb-Dicke regime. The magnetic and thermal environment is strictly monitored to prevent any variation in frequency displacement which would affect the precision and long-term stability of the atomic clock thus formed.

The atomic clock with pulsed interrogation also comprises, in a detection section SD, a module 4 for detecting the response signal, the response signal being defined as the signal delivered by the interactive medium of the cell 3 after elimination of the interactive medium by the laser beams $L_1$ and $L_2$. The detection module 4 is obviously adapted to the wavelength and the amplitude of the response signal in order to deliver an electronic version of the response signal.

More specifically, the module for detecting the response signal may consist of modules carrying out the detection procedures as described in the foregoing table.

According to a particularly notable aspect of the atomic clock with pulsed interrogation according to the present invention, said clock comprises a module 2 for pulse-modulating the intensity of the first and second laser beams $L_1$ and $L_2$ between a high level and a low level of intensity.

Obviously, as illustrated in FIG. 3, the modulation module 2 is positioned in the optical section SO on the path of the first and second laser beam upstream of the interactive cell 3 in order to produce in synchronization a first and a second pulsed laser beam allowing illumination of the interactive medium contained in the cell 3, according to FIG. 2*a*, or the modulated maintained laser wave $L_1$ and the modulated or non-modulated radiofrequency signal MW, according to FIG. 2*b*.

Owing to the illumination of the aforementioned interactive medium by the pulsed first and second laser beam or radiofrequency signal, the interaction between the aforementioned laser beams and the interactive medium is substantially limited to the duration of each successive pulse corresponding to a high level of intensity.

As a result, the response signal produced during a current pulse of rank r, for example, is dependent on the atomic state produced during at least one pulse preceding this current pulse, i.e. on the pulses of rank r−1 to r−p mentioned above in the description, and, of course, on the development of this atomic state for the duration of a low level of intensity energy separating these pulses.

In addition, as illustrated in FIG. 3, the module for detecting the response signal 4 may be followed by a processing module 5, the processing module 5 receiving the electronic version of the response signal and performing a process of addition by linear combination of the response signal produced during the current pulse and during at least one pulse preceding this current pulse, i.e. during the successive prior pulses. The module 5 for processing by linear combination thus produces a resultant compensated atomic clock signal, the spectral width of which is minimized, and constructs a correction signal $S_c$ allowing the frequency of a local oscillator 6 to be controlled.

In FIG. 3, the processing module 5 in fact delivers the correction signal Sc to the module 6 which is installed in an analog section SA and consists, for example, of a local oscillator LO and a synthesizer S delivering, on the one hand, a frequency-controlled periodic signal $S_u$, for use as a frequency reference for an external user, and, on the other hand, a signal $S_{CO}$ for controlling the optical interrogation module 1.

This control signal $S_{CO}$ may, for example, consist of a frequency reference allowing control of the sideband modulation procedure mentioned above in the description in order to obtain the two laser beams $L_1$ and $L_2$, for example from a single laser source. It will be noted that the aforementioned control signal $S_{CO}$ may also allow control of the wavelength and/or the frequency of the single laser source and/or the laser beams $L_1$ and $L_2$ at the chosen value, and also the generation of the radiofrequency signal MW.

The embodiment of this control procedure will not be described in detail, as it corresponds to an embodiment known from the prior art.

Obviously, as is also illustrated in FIG. 3, the atomic clock with pulsed interrogation according to the present invention is equipped with a control unit 7 which may consist of a miocrocomputer connected by a bus link to all of the modules such as the pulse modulation module 2, the module 4 for detecting the response signal and, of course, the processing module 5 and the module 6 serving as the local oscillator LO and/or synthesizer S.

It will be appreciated, in particular, that the control module 7 allows synchronization of all of the aforementioned modules and also control of the modulation pulse trains produced, from an electronic control signal, for example, elaborated by the control unit 7, for controlling the modulation module 2.

It will be noted that the module 2 for pulse-modulating the intensity of the first and second laser beams $L_1$, $L_2$ may consist of an acousto-optic modulator, an electro-optic modulator or, finally, of any other component for modulating the intensity of a light signal, the response time of which is sufficiently brief to provide such modulation. A radiofrequency modulator is provided to modulate the radiofrequency signal MW if necessary.

More specifically, it will be noted that the low level of intensity corresponds to a substantially zero intensity of each of the laser beams or of the radiofrequency signal, which are completely absorbed by the aforementioned modulation module 2.

A more detailed description of the processing module 5 for adding by linear combination of the response signal will now be provided with reference to FIG. 4*a* and FIG. 4*b*.

Generally, it will be appreciated that the aforementioned processing module 5 receives the response signal in the form of an electronic signal delivered by the detection module 4.

In order to process the successive pulses Sr received, the processing module 5 may, as illustrated in FIG. 4*a*, advantageously comprise a module 50 for sampling the response signal produced during the interaction of the current pulse and at least one pulse preceding this current pulse, the aforementioned sampling module 50 being triggered in synchronization with the control of the module 2 for modulating the laser beams $L_1$ and $L_2$.

The sampling module 50 is preferably followed by a module 51 for storing the sampled values of the response signal produced during the interaction of each of the aforementioned pulses.

Finally, the storage module 51 may be followed by a module 52 allowing calculation of a linear combination of the stored sample values, so the compensated atomic clock signal $S_{HC}$ previously mentioned in the description may be produced. On the basis of this signal, a module 53, formed for example by an integrator, delivers the correction signal $S_c$ to the module 6 consisting of the local oscillator LO and the synthesizer S, for example.

The synthesizer S allows production of a microwave signal, the frequency of which is close to the resonance frequency of the transition e→f.

Finally, the control unit 7 may advantageous consist of a workstation or a microcomputer comprising a program for controlling the assembly, so as to synchronize the modulation module 2, the module 4 for detecting the response signal, the processing module 5 previously described in relation to FIG. 4*a* and, of course, the module 6 consisting of the above-described local oscillator and synthesizer.

In particular, in a non-limiting embodiment, it will be noted that the control unit 7 may advantageously be programmed to read, using a control software package, the sampled values stored in the storage module 51 at predetermined instants.

In particular, under these conditions, the control unit 7 may then comprise a program for sorting the stored sampled values for determining for each of the pulses $S_r$ to $S_{r-p}$ the maximum and/or minimum values of each of the sampled values for each of the aforementioned successive pulses.

Thus, in a non-limiting embodiment of the atomic clock according to the present invention, it will be noted that a processing procedure may advantageously consist, as illustrated at point 2 of FIG. 4*b*, for the current pulse $S_r$ of rank r in determining the sampled value of this pulse which has the maximum value, this maximum value being denoted by $M_r$, then, for the successive pulses of prior rank r−1 to r−p, in determining in each of said pulses the minimum of the corresponding sampled values in its successive pulses.

Thus, the corresponding minima are denoted $m_{r-1}$ for the prior pulse immediately preceding the current pulse, this prior pulse being of rank r−1, then the successive values $m_{r-2}$ to $m_{r-p}$ for preceding prior pulses of rank r−2 to r−p.

According to a preferred non-limiting embodiment of the atomic clock with pulsed interrogation according to the present invention, it will be noted that the linear combination of the sampled values may then consist in adding the maximum of the sampled values for the current pulse of rank r and in subtracting the successive minimum values of the prior pulses of rank r−1 to r−p, as illustrated in FIG. 4*b*, or an average value thereof.

It will be appreciated that the sorting program may then carry out the sorting process relative to the origin of each of the pulses, these origins being successively denoted by $o_r$, $o_{r-1}$, $o_{r-p}$.

Thus, owing to the implementation of the processing procedure carried out by the processing module 5 illustrated in FIGS. 3, 4*a* and 4*b*, it will be appreciated, in particular that the maximum $M_r$ of the current pulse of rank r provides the maximum amplitude value for the detected response signal, whereas the subtraction of the successive sampled values, which represent the local minima thereof, allows deduction of a sampled value representing the drifts and disturbances introduced by the interactive medium contained in the cell 3 in order to obtain a compensated atomic clock signal, the spectral width of which is thus minimized and the contrast of which may be substantially improved owing to the elimination of the continuous or slowly variable components representing the drift of the system as a whole.

Obviously, and in order to increase the processing spread and the obtaining of responses in real time for the digital portion of the processing module 5, the modules 51, 52 and 53 may be replaced by a dedicated signal processor programmed for this purpose.

Theoretical and experimental proof relating to the results obtained owing to the implementation of the method and an atomic clock with pulsed interrogation in accordance with the subject-matter of the present invention will be provided hereinafter with reference to FIG. 4*c*.

Taking a CPT-type atomic clock with thermal atoms in which the interactive medium is exempt from buffer gas, the width of the oscillation line obtained for the clock signal—a width at 3 dB relative to the maximum amplitude at the oscillation peak—is a few kHz for a central frequency of approximately a few GHz. Such a line width is too great to be compatible with a use of atomic clocks of this type as a reference clock. This may be explained by the fact that in the absence of buffer gas, the atoms of the interactive medium are subjected to excessive rapid erratic displacement which broadens the phenomenon of resonance caused by the Doppler effect and limitation of the transit time and, finally, the quality of the radio-electric resonator thus formed.

If, on the other hand, a buffer gas is used in this same type of clock, the Lamb-Dicke regime is reached and the line width of the atomic clock signal is limited mainly by the relaxation of the coherence in the basic state and the widening caused by laser saturation. Line widths of approximately 100 Hz have been obtained to date. Short-term stabilities of the frequency of the user signal $S_u$ of approximately 5 to 15 $10^{-12}$ after 1 second of integration have been measured with optical or microwave detection of the aforementioned clock signal. The long-term stability is basically limited by the frequency fluctuations induced by the collisions with the buffer gas. The corresponding frequency displacement relative to Raman non-correspondence is directly associated with the buffer gas pressure which is, for its part, a function of the temperature of the interactive medium and therefore of the cell.

The line width $\Delta f_{CPT}$ of the resonance signal and the clock signal in a clock of this type has a value given by Equation (1).

$$\Delta f_{CPT}=\Delta f_{TT}+\Delta f_{collision}+\Delta f_{Doppler}+\Delta f_{saturation} \quad (1)$$

In this equation:

$\Delta f_{TT}$ describes the widening due to the limited transit time of the atoms of the interactive medium through the laser beams.

For continuous interrogation, $\Delta f_{TT}$ varies as 1/T wherein T designates the time of interaction between an atom and the laser waves.

For pulsed interrogation in accordance with the embodiment of the method and the clock with pulsed interrogation according to the present invention, $\Delta f_{TT}$ varies as ½b wherein b designates the dead time between two consecutive pulses of a pulse train;

$\Delta f_{collision}$ is the widening of the line resulting from the damping of the coherence due to collisions between atoms;

$\Delta f_{Doppler}$ is the widening caused by the first order Doppler effect;

$\Delta f_{saturation}$ is the widening by saturation associated with the real intensities of the laser beams illuminating the interactive medium.

For a CPT atomic clock, the interactive medium of which consists of thermal atoms in the form of steam:

$\Delta f_{Doppler}$ and $\Delta f_{TT}$ are negligible owing to the presence of the buffer gas;

$\Delta f_{saturation}$ may re reduced by adjusting the laser power, although this is to the detriment of the signal-to-noise ratio, as previously mentioned in the introductory part of the description for prior art devices with continuous interrogation;

$\Delta f_{collision}$ is the predominant source of the widening of the line forming the atomic clock signal obtained.

FIG. 4*c* illustrates the embodiment of the method according to the present invention using an atomic clock with pulsed interrogation in which the interactive medium consists of thermal caesium atoms in the presence of a buffer gas formed by nitrogen. It shows the amplitude of the compensated clock signal $S_{HC}$ as a function of the non-correspondence of the difference of the frequencies $\Delta f_{12}$ of the two laser waves.

The x axis of FIG. 4*c* is demarcated in kHz relative to a value 0 at the origin of the Raman non-correspondence. The distance δ represents the non-correspondence introduced owing to the presence of the buffer gas. This frequency bias may be reduced using two buffer gases, nitrogen and argon for example, inducing collisional displacements having opposing signs.

With reference to the aforementioned figure, it will be noted that for the maximum amplitude measured in millivolts on the y-axis, the width of the oscillations remains as low as 25 Hz owing to the processing and, of course, the pulse-modulation of the laser beams $L_1$ and $L_2$ used. If, on the other hand and according to a particularly notable aspect of the method and the atomic clock with pulsed interrogation in accordance with the subject-matter of the present invention, the interactive medium consists of laser-cooled atoms, the speed of the atoms is reduced under the conditions previously mentioned in the description, i.e. at erratic speeds approximately 1,000 times lower than those of thermal atoms.

Under these conditions, it is thus possible to obtain long times of interaction between the illumination laser beams and the interactive medium without the use of a buffer gas, thus allowing cancellation of the resonance displacement δ, previously mentioned in relation to FIG. 4*c*, and widening of frequencies caused by collisions.

Thus, for a clock with pulsed interrogation, a CPT atomic clock with cold atoms, the aforementioned parameters are then treated as follows:

$\Delta f_{Doppler}$ and $\Delta f_{TT}$ are negligible owing to the low speed of the cold, laser-cooled atoms;

$\Delta f_{collision}$ is also negligible if the density of cold atoms is sufficiently low.

The rubidium atom would appear to be more beneficial than the caesium atom in this regard, as the collisional displacement is at least 50 times lower.

It will thus be noted that it is widening by saturation $\Delta f_{saturation}$ which limits the line width of an atomic clock, the interactive medium of which consists of laser-cooled atoms.

Moreover, if the interrogation procedure is carried out in accordance with the method according to the present invention, i.e. by pulsed interrogation, it is then possible significantly to reduce the contribution of the saturation effect while at the same time continuing to detect those signals of sufficient intensity, i.e. with a satisfactory signal-to-noise ratio.

The invention claimed is:

1. A method for generating an atomic clock signal with coherent population trapping from a first and a second phase-coherent laser wave, each substantially in resonance with an optical transition of the atoms of an interactive medium, the coherent superimposition of the atomic states corresponding to the coherent population trapping of atoms producing a response signal having a resonance-extremal amplitude and representing the atomic clock signal corresponding to the variation in amplitude of the signal detected as a function of the value of the difference in frequency of the first and the second phase-coherent laser wave, wherein said method consists at least in modulating in synchronization by successive pulses the intensity of the first and the second laser wave, by a shape factor determined between a high level and a low level of intensity, the interaction between the first or the second laser wave respectively and the interactive medium being substantially limited to the duration of each successive pulse corresponding to a high level of intensity, said response signal produced during a current pulse depending on the atomic state produced during at least one pulse preceding this current pulse and on the development of this atomic state for the duration of a low level of intensity separating said pulses; and detecting and superimposing by linear combination said response signal produced during said current pulse and at least one pulse preceding this current pulse to produce a resultant compensated atomic clock signal, the spectral width of which is minimized.

2. The method as claimed in claim 1, wherein the pulse modulation is carried out by pulse trains, the frequency of the modulation pulses being between 0.2 Hz and $10^4$ Hz.

3. The method as claimed in claim 1, wherein the modulation pulses have a shape factor of between $10^{-6}$ and $10^{-1}$.

4. The method as claimed in claim 1, wherein the duration of a low level of intensity separating said current pulse from said pulse preceding this current pulse is shorter than the lifetime of the hyperfine coherence existing between two clock levels.

5. The method as claimed in claim 1, wherein said interactive medium is formed by a plurality of thermal or laser-cooled atoms.

6. The method as claimed in claim 1, wherein the step consisting in detecting said clock signal is chosen as one of the detection processes from among the group of detection processes comprising optical absorption, optical fluorescence, microwave detection, as a function of the difference in frequency of the first and the second phase-coherent laser waves.

7. The method as claimed in claim 1, wherein said method consists in replacing one of the laser waves for exciting the interactive medium with a radiofrequency signal, the frequency of which is substantially equal to the transition frequency of the atoms of the interactive medium, said method consisting in modulating by successive pulses either the maintained laser wave or the maintained laser wave and the radiofrequency signal.

8. An atomic clock with pulsed interrogation, comprising at least an optical interrogation means allowing the production of a first and a second phase-coherent laser beam, each substantially in resonance with an optical transition of the atoms of an interactive medium; an interactive cell comprising said interactive medium, illuminated in operation by the first and the second phase-coherent laser beam, to produce a response signal having a resonance-extremal amplitude and corresponding to the variation in amplitude of the signal detected as a function of the difference in frequency of the first and the second phase-coherent laser beam; means for detecting said response signal, said detection means being adapted to the wavelength and to the amplitude of the response signal, wherein said atomic clock further comprises means for pulse-modulating the intensity of the first and the second laser beam between a high level and a low level of intensity, said modulation means being placed on the path of said first and second laser beams upstream of said interactive cell to produce in synchronization a first and a second pulsed laser beam, the interaction between the first or the second laser beam respectively and the interactive medium being substantially limited to the duration of each successive pulse corresponding to a high level of intensity, said response signal produced during a current pulse being dependent on the atomic state produced during at least one pulse preceding this current pulse and on the development of this atomic state for the duration of a low level of intensity energy separating said pulses, and wherein said detection means further comprise means for adding by linear combination the response signal produced during this current pulse and the response signal produced during at least one pulse preceding this current pulse, said means for adding by linear combination allowing the production of a resultant compensated atomic clock signal, the spectral width of which is minimized.

9. The atomic clock as claimed in claim 8, wherein said means for pulse-modulating the intensity of the first and the second laser beam between a high level of intensity and a low level comprise at least one acousto-optic modulator.

10. The atomic clock as claimed in claim 8, wherein said detection means further comprise means for sampling the response signal produced during the interaction of the current pulse and at least one pulse preceding this current pulse; and means for storing sampled values of the response signal produced during the interaction of each of said pulses.

11. The atomic clock as claimed in claim 10, wherein said detection means further comprise means for reading the values sampled at predetermined instants stored in said storage means; and means for calculating a linear combination of said stored sampled values allowing the production of said compensated atomic clock signal.

12. The atomic clock as claimed in claim 8, wherein one of the laser beams is replaced by a radiofrequency signal, the maintained laser beam or the maintained laser beam and the radiofrequency signal being subjected to modulation by successive pulse trains.

13. The atomic clock as claimed in claim 9, wherein said detection means further comprise means for sampling the response signal produced during the interaction of the current pulse and at least one pulse preceding this current pulse; and means for storing sampled values of the response signal produced during the interaction of each of said pulses.

14. The atomic clock as claimed in claim 9, wherein one of the laser beams is replaced by a radiofrequency signal, the maintained laser beam or the maintained laser beam and the radiofrequency signal being subjected to modulation by successive pulse trains.

15. The atomic clock as claimed in claim 10, wherein one of the laser beams is replaced by a radiofrequency signal, the maintained laser beam or the maintained laser beam and the radiofrequency signal being subjected to modulation by successive pulse trains.

16. The atomic clock as claimed in claim 11, wherein one of the laser beams is replaced by a radiofrequency signal, the maintained laser beam or the maintained laser beam and the radiofrequency signal being subjected to modulation by successive pulse trains.

17. The method as claimed in claim 2, wherein the modulation pulses have a shape factor of between $10^{-6}$ and $10^{-1}$.

18. The method as claimed in claim 2, wherein the duration of a low level of intensity separating said current pulse from said pulse preceding this current pulse is shorter than the lifetime of the hyperfine coherence existing between two clock levels.

19. The method as claimed in claim 2, wherein said interactive medium is formed by a plurality of thermal or laser-cooled atoms.

20. The method as claimed in claim 2, wherein the step consisting in detecting said clock signal is chosen as one of the detection processes from among the group of detection processes comprising optical absorption, optical fluorescence, microwave detection, as a function of the difference in frequency of the first and the second phase-coherent laser waves.

* * * * *